United States Patent [19]

Jeng

[11] Patent Number: 5,708,303
[45] Date of Patent: Jan. 13, 1998

[54] SEMICONDUCTOR DEVICE HAVING DAMASCENE INTERCONNECTS

[75] Inventor: Shin-Puu Jeng, Plano, Tex.

[73] Assignee: Texas Instruments Incorporated, Dallas, Tex.

[21] Appl. No.: 742,959

[22] Filed: Nov. 1, 1996

Related U.S. Application Data

[60] Continuation of Ser. No. 482,721, Jun. 7, 1995, abandoned, which is a division of Ser. No. 306,545, Sep. 15, 1994, abandoned.

[51] Int. Cl.$^6$ .................... H01L 23/48; H01L 23/52; H01L 29/40
[52] U.S. Cl. .................... 257/758; 257/751; 257/760; 257/763; 257/764; 257/768; 257/774
[58] Field of Search .................... 257/758, 759, 257/760, 751, 763, 764, 768, 774

[56] References Cited

U.S. PATENT DOCUMENTS

| | | |
|---|---|---|
| 4,613,888 | 9/1986 | Mase et al. .................... 257/774 |
| 4,618,878 | 10/1986 | Aoyama et al. .................... 257/760 |
| 5,216,281 | 6/1993 | Butler .................... 257/760 |
| 5,319,246 | 6/1994 | Nagamine et al. .................... 257/760 |
| 5,345,108 | 9/1994 | Kikkawa .................... 257/751 |

*Primary Examiner*—Carl W. Whitehead
*Attorney, Agent, or Firm*—Brian A. Carlson; James C. Kesterson; Richard L. Donaldson

[57] ABSTRACT

This is a device and method of optimizing capacitance and performance for multilevel interconnects. The device comprising: a semiconductor layer 70; a first high-k layer 68 above the semiconductor layer; a first insulating layer 66 above the first high-k layer 68; an interconnect layer 58 above the first insulating layer 66; a second insulating layer 64 around the interconnect layer 58; and a second high-k layer 52 above the second insulating layer 64 and the interconnect layer 58. The device may have a low-k material inserted between closely spaced metal interconnects. Alternatively, the device may have air gaps between closely spaced metal interconnects. In addition, the first high-k layer may be used as an oxide etch stop.

25 Claims, 8 Drawing Sheets

SEMICONDUCTOR DEVICE HAVING DAMASCENE INTERCONNECTS

CROSS REFERENCE TO RELATED APPLICATION

This application is a continuation of application Ser. No. 08/482,721 filed on Jun. 7, 1995 now abandoned, which is a divisional of application Ser. No. 08/306,545 filed Sep. 15, 1994 now abandoned.

The following coassigned patent application is hereby incorporated herein by reference:

| Ser. No. | Filing Date | TI Case No. |
|---|---|---|
| 08/137,658 | 10/15/93 | TI-18509 |

FIELD OF THE INVENTION

This invention relates to semiconductor device manufacturing, and specifically to optimizing crosstalk voltage between interconnect lines within semiconductor devices.

BACKGROUND OF THE INVENTION

Today's very large scale integration (VLSI) chip can have more than 4 million transistors in an area of 300 mm square, and operate at a clock frequency of over 100 MHz (A. Denboer, *Semiconductor International* 2, 64, 1994). Components with various functions are interconnected with as many as 5 levels of dense metal lines. As the functional complexity of devices increase, the number of interconnection levels, die size and metal length are likely to continue to increase. Since interconnect already constitutes a major portion of the VLSI process flow, the reliability, compatibility and simplicity of interconnect processes significantly impacts the overall yield and cost of devices.

The performance of multilevel interconnects is dominated by interconnect capacitance at deep sub-micron regions. Dielectric materials with lower values of permittivity are needed to reduce interconnect capacitance. (The dielectric constant is based on a scale where 1.0 represents the dielectric constant of a vacuum. Various materials exhibit dielectric constants from very near 1.0 to values in the hundreds. For example, silicon dioxide has a dielectric constant of about 3.9. As used herein, the term low-k will refer to a material with a dielectric constant less than 3.9. Conversely, the term high-k will refer to material with a dielectric constant higher than 3.9.) The low-k dielectric insertion scheme described in the cross-referenced application, Ser. No. 08/137,658 fled on Oct. 15, 1993, effectively reduces line-to-line capacitance, resulting in significant improvement in both RC delay time and power dissipation.

However, in addition to RC delay and power dissipation, crosstalk is another important factor for interconnect performance. Crosstalk noise is generated when one metal line is switching and, due to the large line-to-line capacitance, nearby metal lines also experience a voltage change. If the crosstalk is large enough, the nearby inactive metal line can receive an erroneous signal and create a system malfunction. The coupling noise problem, i.e., crosstalk, is becoming a critical issue as voltage scales downward and noise margin shrinks.

SUMMARY OF THE INVENTION

As an approximation, crosstalk voltage $V_c$ is proportional to the ratio between line-to-line capacitance $C_{l-l}$ and the sum of line-to-line (intralayer) $C_{l-l}$ and interlayer capacitance $C_{l-g}$, as illustrated by following equation:

$$V_c \propto \frac{C_{l-l}}{C_{l-l} + C_{l-g}}$$

In order to effectively reduce crosstalk voltage, we need to increase the interlayer capacitance, while lowering the line-to-line capacitance as much as possible.

The present invention reduces crosstalk voltage by including a dielectric material having a higher permitivity between two metal layers (or between metal layers and active devices) to increase interlayer capacitance, and inserting a low-dielectric-constant material between metal lines. This strategy can be easily adopted by several different low-k insertion schemes. The performance advantage of both low-k and high-k layers can be optimized by tailoring, (1) the distance between high-k and adjacent metal layers, (2) the thickness of the high-k layer, (3) the depth of the low-k trench (a deeper trench would further reduce the line-to-line capacitance), (4) the total dielectric stack thickness, (5) the permitivity of the low-k dielectric layer, (6) the permitivity of the high-k layer, (7) the metal density of neighboring level(s), (8) the number of high-k layers, (9) the number and position of ground plate, and (10) the metal thickness.

In addition, the high-k layer (e.g. $Si_3N_4$) could be used as an etch stop for the trench etch between metal lines. This would allow the additional advantage of controlling trench depth.

This is a device and method of optimizing capacitance and performance for multilevel interconnects. The device comprising: a semiconductor layer; a first high-k layer above the semiconductor layer; a first insulating layer above the first high-k layer; an interconnect layer above the first insulating layer; a second insulating layer around the interconnect layer; and a second high-k layer above the second insulating layer and the interconnect layer. The device may have a low-k material inserted between closely spaced metal interconnects. Alternatively, the device may have air gaps between closely spaced metal interconnects. In addition, the first high-k layer may be used as an oxide etch stop.

BRIEF DESCRIPTION OF THE DRAWINGS

This invention can be best understood by reference to the following drawing(s), in which.

DESCRIPTION OF THE PREFERRED EMBODIMENTS

The present invention is described in relation to the preferred embodiments detailed in FIGS. 1-23. The figures show different embodiments where a high-k dielectric layer below and above the various structures will optimize the capacitance and performance of the devices.

Figure 1:
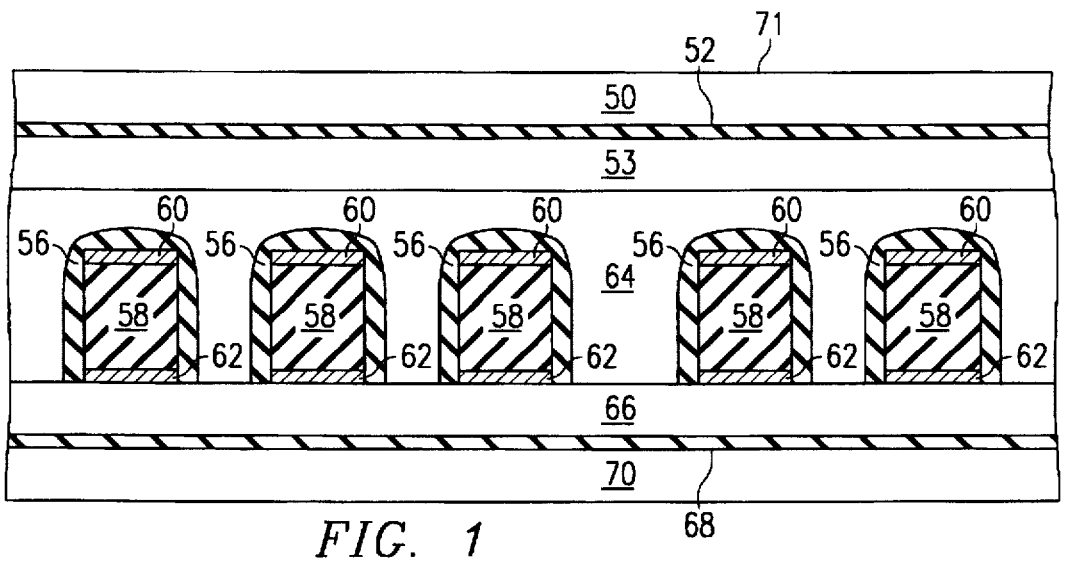
FIGS. 1–6 are cross-sectional views of a semiconductor device fabricated according to alternate embodiments of the invention.

FIG. 1 shows an example embodiment. The bottom layer 70 is composed of an insulating material such as silicon dioxide or other low-k dielectric material. A layer 68 of high-k material (e.g. $Si_3N_4$, where k is the range from 6 to 9) is deposited above the insulating layer. Another insulating layer 66 (e.g. silicon dioxide) is then deposited above the high-k material 68. The interconnect leads are then layered above the insulating layer 66. The interconnect leads are composed of a metal barrier layer 62 (e.g. TIN), a metal layer 58 and a metal cap layer 60 (e.g. TIN). After the interconnect leads are patterned and etched, an optional silicon dioxide liner 56 is conformally formed around the interconnect leads. (Although the optional silicon dioxide liner could be implemented in the other embodiments, in order to avoid confusion, this optional silicon dioxide liner will not be shown in the other embodiments.) A layer of low-k material 64 (e.g. polysilsequioxane spin-on-glass) is then formed around the interconnect leads and silicon dioxide liners 56. The spin-on-glass 64 would then be cured. A layer of silicon dioxide 53 would then be deposited and planarized above the spin-on-glass layer 64. A second high-k layer 52 would then be deposited above the silicon dioxide layer 53. A final layer of silicon dioxide 50 would then be deposited above the high-k layer 52. In order to connect to the next level of metal interconnect, vias are etched through dielectric layer 50, 52, 53, 64 and 56, and are fried with CVD metal (e.g. tungsten). The interlayer capacitance of the first layer of interconnects can be further increased by selectively grounding portions of a second metal layer which starts at the ground plane 71. The added ground plane 71 helps reduce the crosstalk voltage for the narrowly spaced interconnects. Similarly, the interlayer capacitance of the second layer of interconnects can be increased by grounding portions of the first layer and/or the third metal layer when signals transmit through the second metal layer. The same process may be repeated to facilitate multilevel interconnection.

Figure 2:
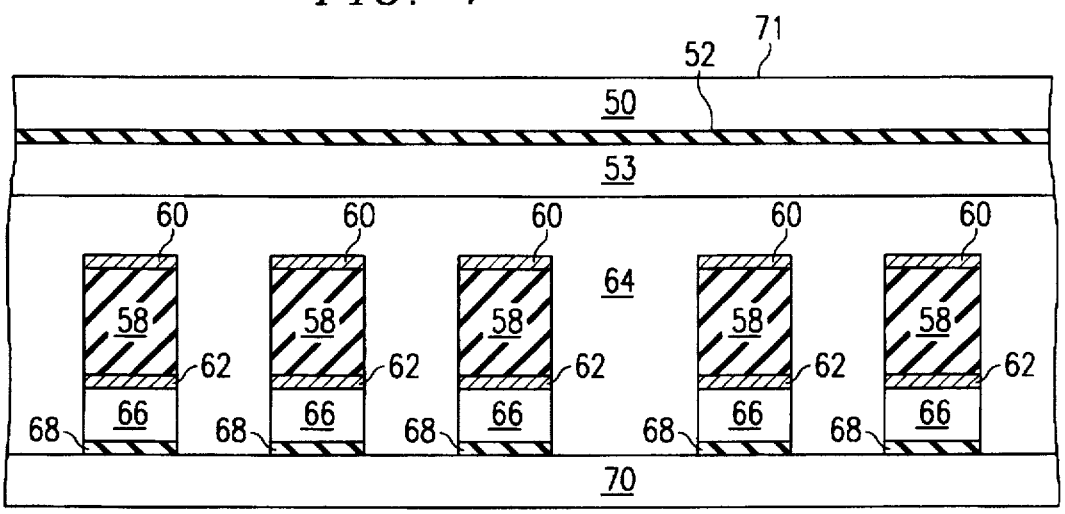

FIG. 2 shows another example embodiment similar to FIG. 1. In FIG. 2, the insulating layer 70, high-k layer 68, insulating layer 66, metal barrier layer 62, metal layer 58 and metal cap layer 60 are formed in the same method as FIG. 1. However, when the interconnect leads 62, 58, 60 are patterned and etched, the insulating layer 66 and the high-k layer 68 are also etched. The low-k material 64 extends beyond metal barrier layer 62, and hence further reduces the line-to-line capacitance. The layer of silicon dioxide 53, the second high-k layer 52 and the final layer of silicon dioxide 50 would then be formed as in FIG. 1. As in FIG. 1, the next level of interconnects may be produced by repeating this process. In creating a next level, the second high-k layer 52 may be etched when the next level of metal interconnects is patterned and etched.

Figure 3:
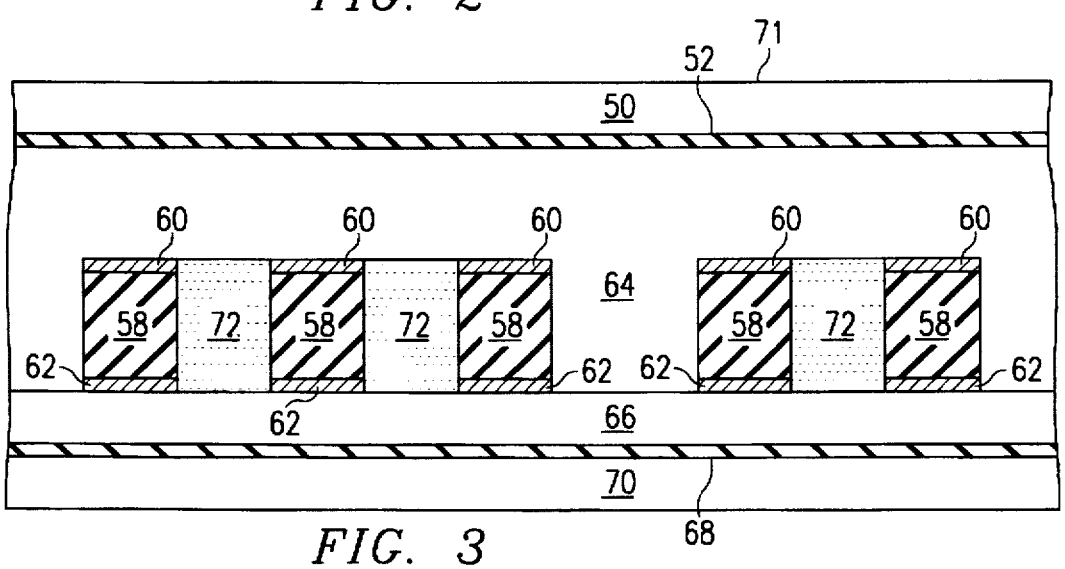

FIG. 3 shows another example embodiment similar to the FIG. 1. In FIG. 3, the insulating layer 70, high-k layer 68, insulating layer 66, metal barrier layer 62, metal layer 58 and metal cap layer 60 are formed in the same method as FIG. 1. However, when after interconnect leads 62, 58, 60 are patterned and etched, the silicon dioxide layer 64 is non-conformally deposited (e.g. chemical vapor deposition) in order to form air gaps 72 between the interconnect leads. The silicon dioxide layer would then be planarized (e.g. chemical-mechanical planarization). Another layer of high-k material 52 would then be deposited above the silicon dioxide layer 64. A final layer of silicon dioxide 50 would then be deposited above the high-k layer 52.

Figure 4:
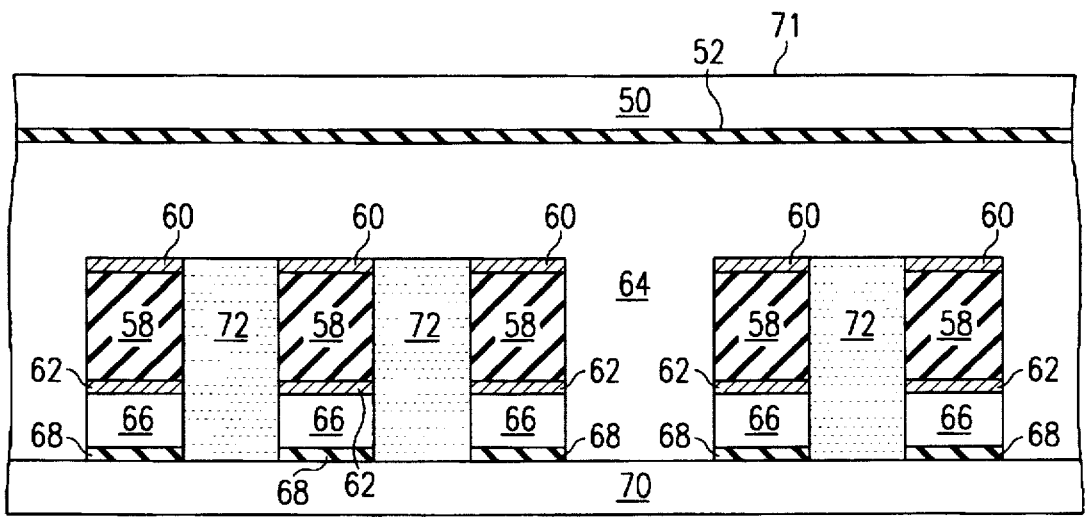

FIG. 4 shows another example embodiment similar to FIG. 3. In FIG. 4, the insulating layer 70, high-k layer 68, insulating layer 66, metal barrier layer 62, metal layer 58 and metal cap layer 60 are formed in the same method as FIG. 3. However, when the interconnect leads 62, 58, 60 are patterned and etched, the insulating layer 66 and the high-k layer 68 are also etched. The air gaps 72 extend beyond metal barrier layer 62, and hence further reduce the line-to-line capacitance. After the interconnect leads 62, 58, 60 are patterned and etched, the silicon dioxide layer 64 is non-conformally deposited (e.g. chemical vapor deposition) in order to form air gaps 72 between the interconnect leads. The silicon dioxide layer would then be planarized (e.g. chemical-mechanical planarization). Another layer of high-k material 52 would then be deposited above the silicon dioxide layer 64. A final layer of silicon dioxide 50 would then be deposited above the high-k layer 52. In addition, if a next level is created, the second high-k layer 52 may be etched when the metal interconnects are patterned and etched.

Figure 5:
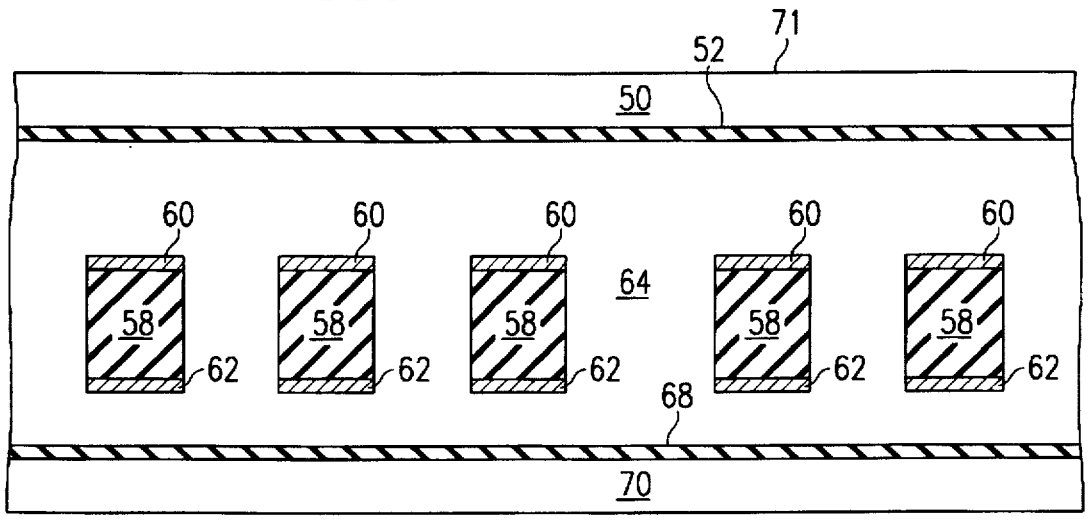

FIG. 5 shows another example embodiment similar to FIG. 1. In FIG. 5, the insulating layer 70, high-k layer 68, are formed in the same method as in FIG. 1. However, the material surrounding the metal barrier layer 62, metal layer 58 and metal cap layer 60 is composed of all the same material. This material 64 is preferably a low-k material or silicon dioxide. The second high-k layer 52 and the silicon dioxide layer 50 would then be formed as in FIG. 1.

Figure 6:
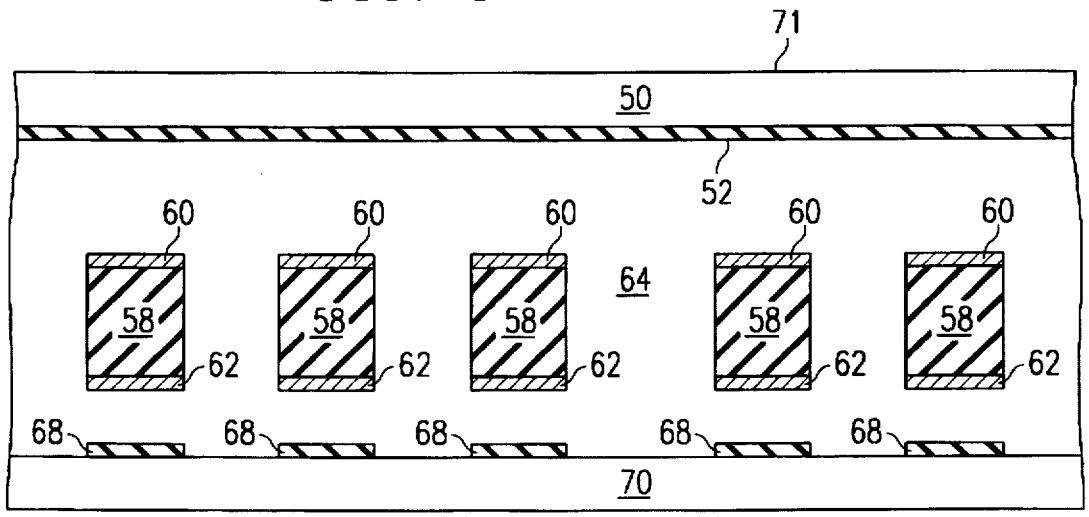

FIG. 6 shows another example embodiment similar to FIG. 5. In FIG. 6, the insulating layer 70, high-k layer 68, metal barrier layer 62, metal layer 58, metal cap layer 60, and insulating layer 64 are formed in the same method as FIG. 5. However, when the interconnect leads 62, 58, 60 are patterned and etched, the insulating layer 64 and the high-k layer 68 are also etched. The second high-k layer 52 and the final layer of silicon dioxide 50 would then be formed as in FIG. 5. In addition, if a next level is created, the second high-k layer 52 may be etched when the metal interconnects are patterned and etched.

Figure 7:
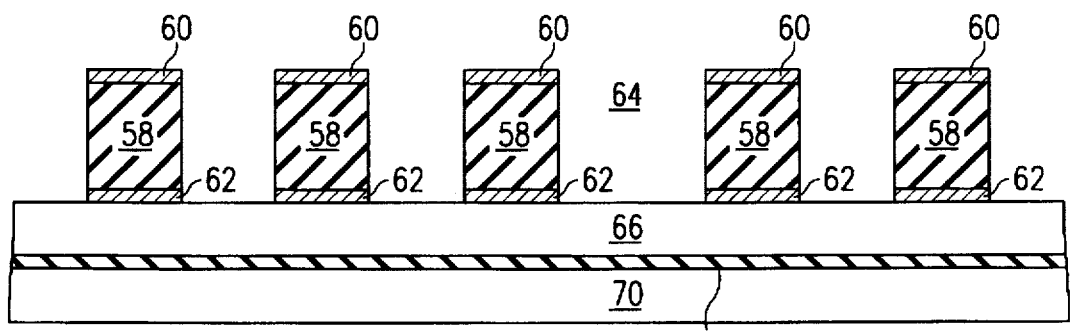
FIGS. 7–10 are cross-sectional views of a semiconductor device depicting an example of subsequent steps to produce yet another embodiment of the invention.

FIGS. 7-10 show a process sequence of forming yet another embodiment. FIG. 7 starts off an insulating layer 70 (e.g. silicon dioxide) and a layer of high-k material 68. Another insulating layer 66 would then be deposited. Metal barrier layer 62, metal layer 58 and metal cap layer 60 would then be formed, patterned and etched. In addition, as in FIG. 2, 4, and 6, the silicon dioxide 66 and the high-k layer may also be etched during the metal etching process. After metal etching, an optional silicon dioxide liner may be formed around the interconnect leads as shown in FIG. 1.

Figure 8:
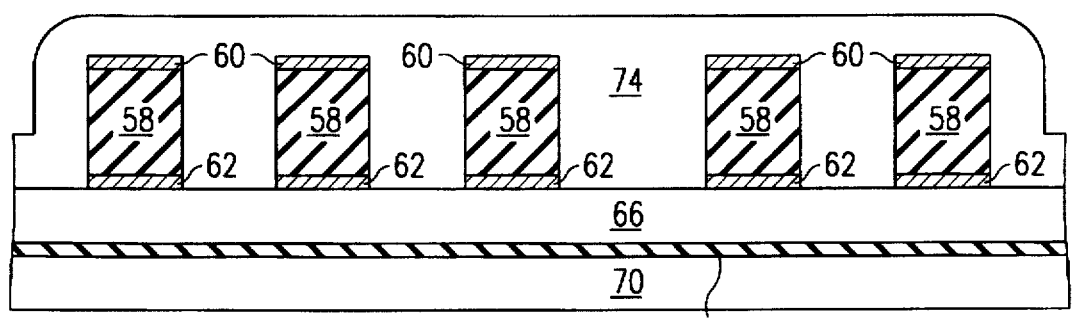

FIG. 8 then shows a conformal deposition of a low-k material 74 (e.g. a parylene). The low-k material 74 would be deposited on and around the interconnect leads.

Figure 9:
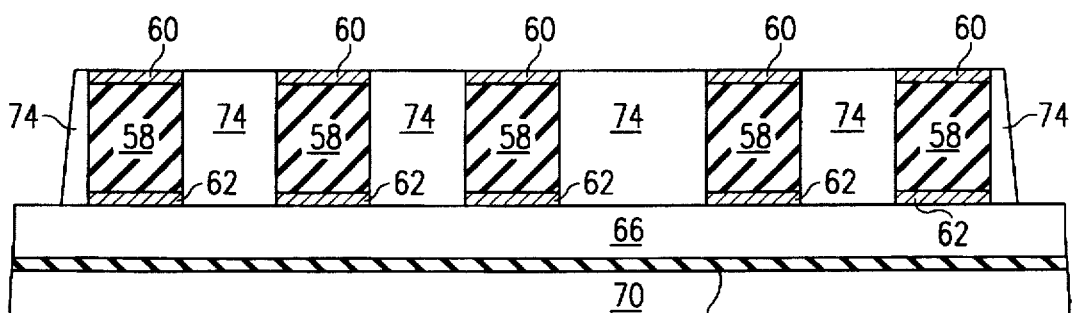

FIG. 9 then shows the low-k material 74 after etchback. The low-k material is completely removed from the outside area of the metal interconnects, but preserves the material between the metal interconnects.

Figure 10:
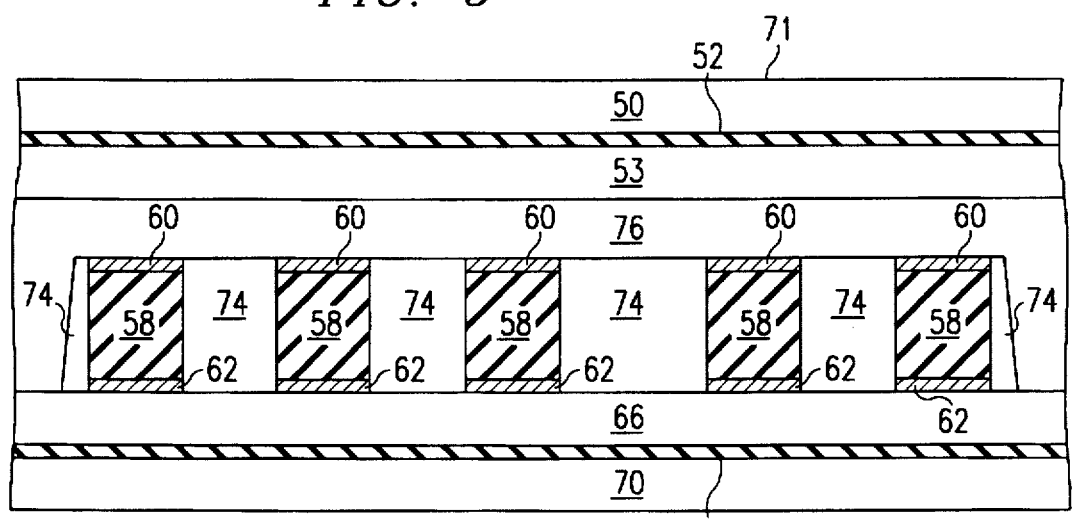

FIG. 10 shows the embodiment after silicon dioxide layer 76 has been deposited and planarized. An optional second layer of silicon dioxide 53 would then be deposited. Next, a second layer of high-k material 52 would be formed. A final layer 50 of silicon dioxide or other insulating material would then be formed.

Figure 11:
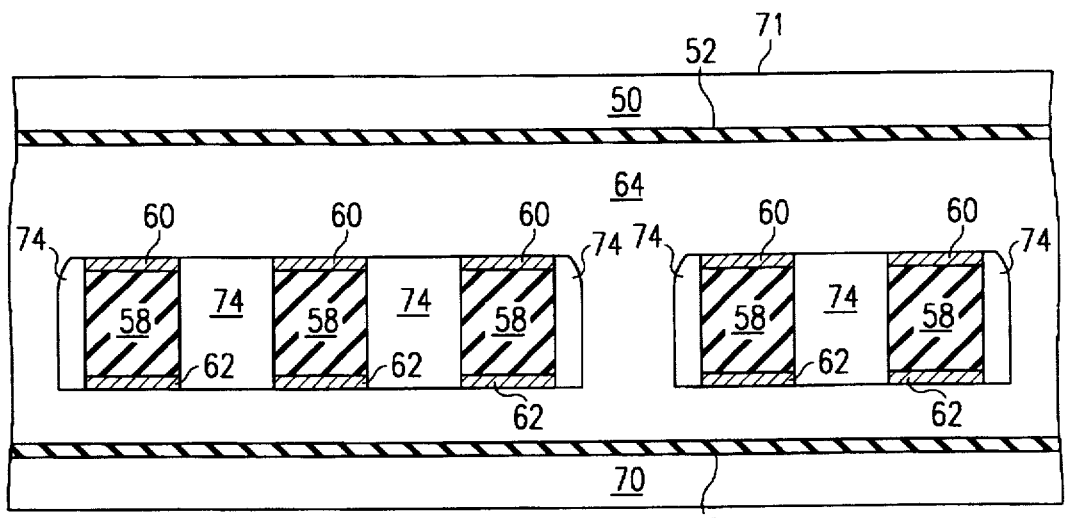
FIGS. 11–13 are a cross sectional views of example semiconductor devices fabricated according to the process sequence detailed in FIGS. 7–10.

FIG. 11 shows an example embodiment made by the process sequence detailed in FIGS. 7-10. The insulating layer 70, high-k layer 68, silicon dioxide layer 66, metal barrier layer 62, metal layer 58, metal cap layer 60 are formed as in FIG. 7. The conformal low-k polymer 74 layer is then deposited and etched around the interconnect leads as in FIGS. 8 and 9. The silicon dioxide layer 76 and an optional second layer of silicon dioxide 53 would then be formed as in FIG. 10. Additionally, a second layer of high-k material 52 and a final layer 50 of silicon dioxide or other insulating material would then be formed as in FIG. 10.

Figure 12:
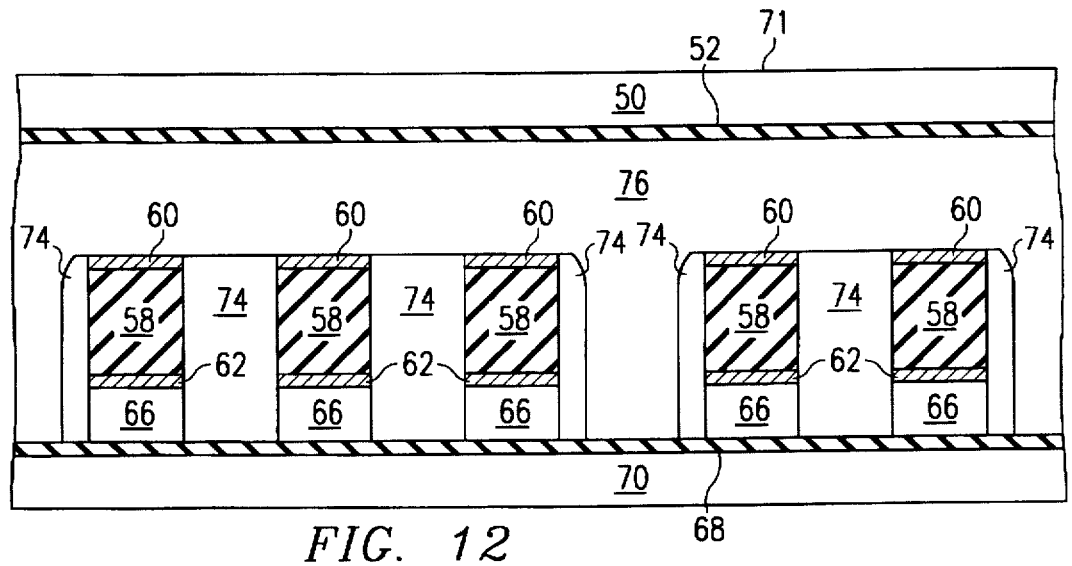

FIG. 12 is formed similar to FIG. 11. The insulating layer 70, high-k layer 68, silicon dioxide layer 66, metal barrier layer 62, metal layer 58, and metal cap layer 60 are formed utilizing the similar methods. However, during metal etch, the silicon dioxide 66 is etched, while the high-k layer 68 is used as an etch stop. Yet, the silicon dioxide layer 76, a second layer of high-k material 52 and a final layer 50 of silicon dioxide or other insulating material would then be formed as in FIG. 11.

Figure 13:
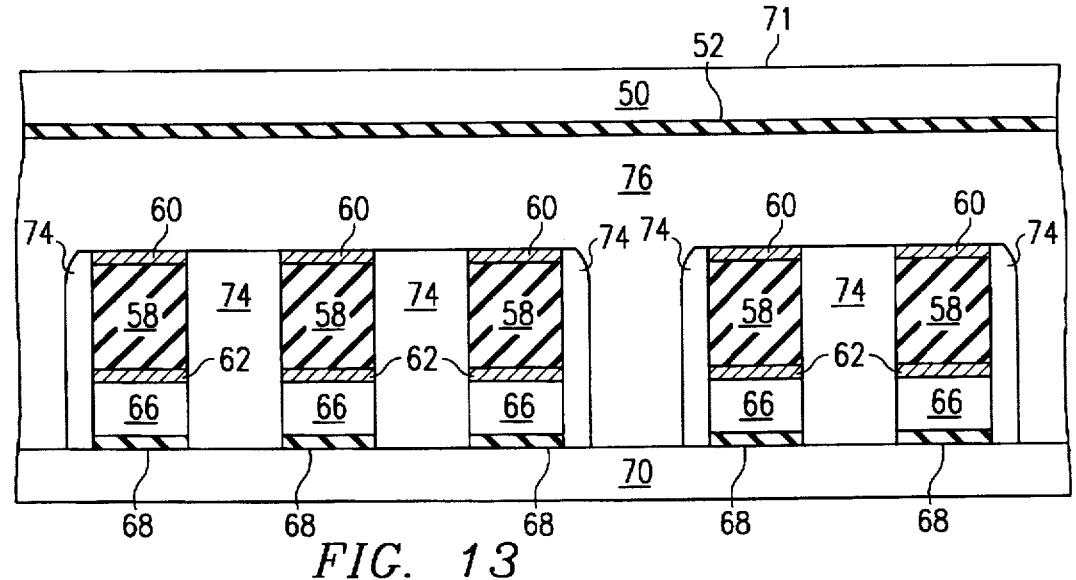

FIG. 13 is formed similar to FIG. 12. However, during the metal etch, in addition to etching the silicon dioxide layer 66, the high-k layer 68 is also etched. Otherwise, the processing for FIG. 13 is similar to that of FIG. 12. In addition, if a next level is created, the second high-k layer 52 may be etched when the metal interconnects are patterned and etched.

Figure 14:
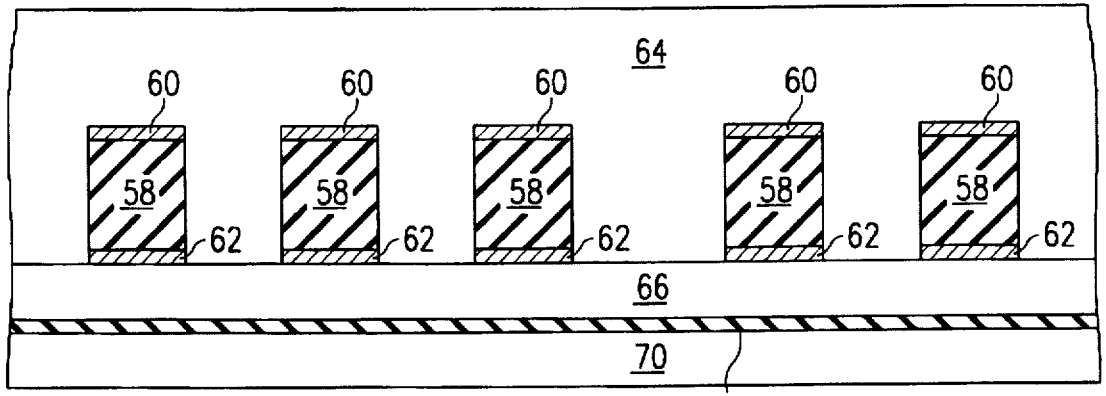
FIGS. 14–17 are cross-sectional views of a semiconductor device depicting an example of subsequent steps to produce yet another embodiment of the invention.

FIGS. 14-17 show a process sequence of forming yet another embodiment FIG. 14 shows an insulating layer 70, a high-k layer 68 and a silicon dioxide layer formed similar to the previous embodiments. Moreover, the metal barrier layer 62, metal layer 58 and the metal cap layer 60 are formed, patterned and etched similar the previous embodiments. Additionally, a layer of silicon dioxide 64 is then deposited over the interconnect leads.

Figure 15:
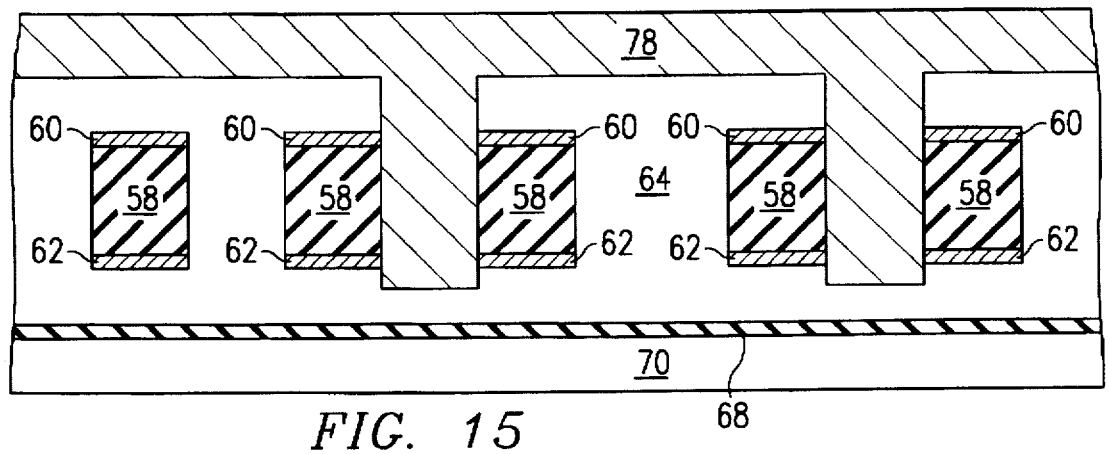

However, a few differences from the previous embodiments are shown in FIG. 15. Trenches are rust patterned and etched between closely spaced interconnect leads. Then a layer of low-k material 78 (e.g. a polyimide) is deposited.

Figure 16:
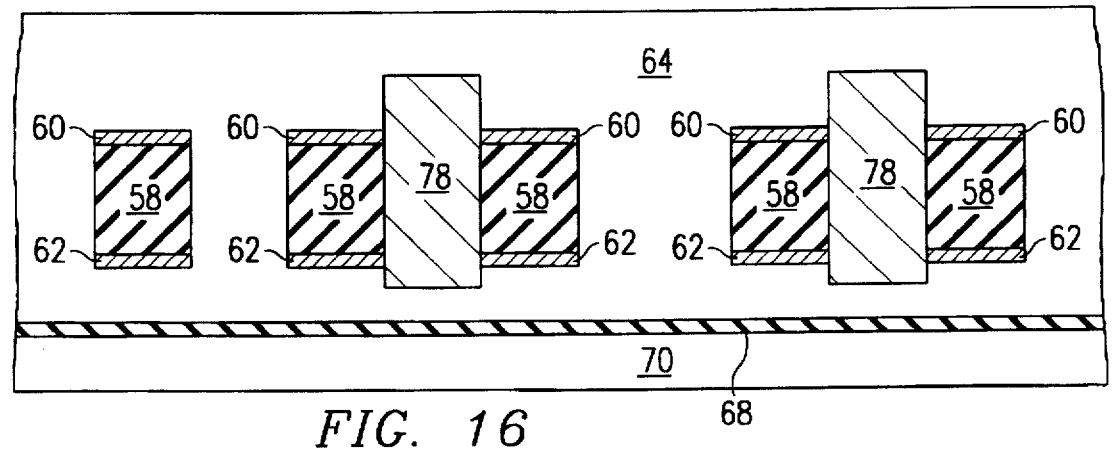

FIG. 16 shows the polymer material 78 after etchback. In addition, another layer of silicon dioxide 64 is then formed on top of the polymer 78 and the previous layer of silicon dioxide 64 (the previous and the new layer of silicon dioxide is shown as the same layer).

Figure 17:
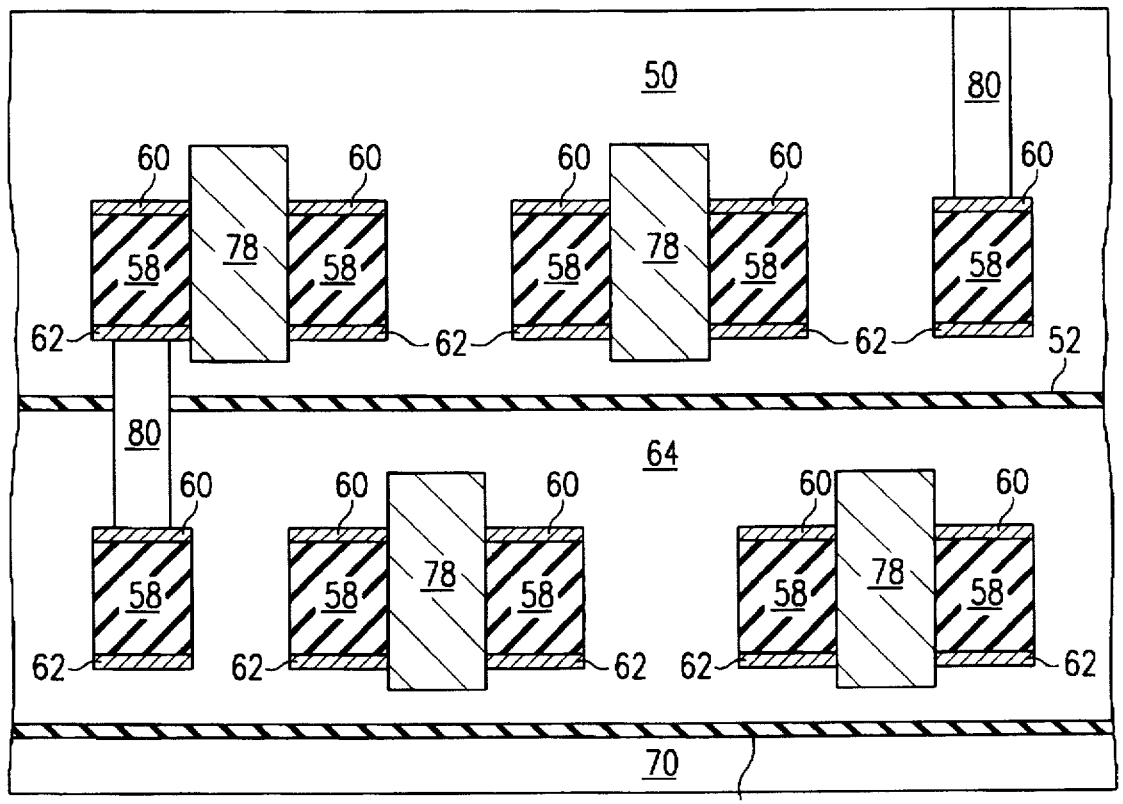

FIG. 17 shows an embodiment with multiple levels of the embodiment shown in FIG. 16. A second high-k layer 52 separates the two levels while a via 80 connects them. Trenches for the vias are first patterned, then etched and then fried with a CVD metal (e.g. tungsten) 80. But, otherwise, the interconnect leads 62, 58, 60 and the silicon dioxide layers 64, 50 are formed in a similar fashion on both levels.

Figure 18:
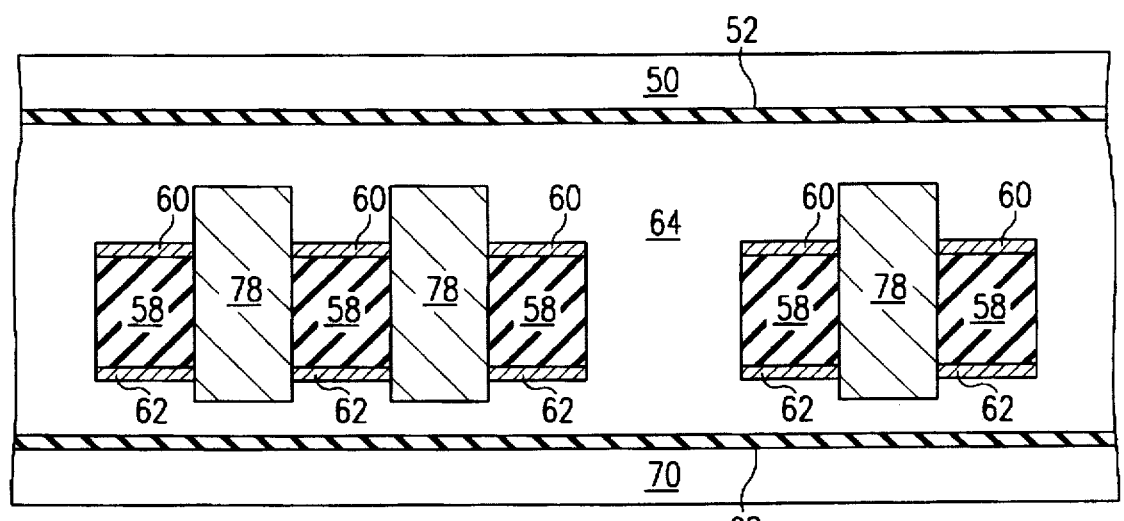
FIGS. 18–19 are a cross sectional views of example semiconductor devices fabricated according to the process sequence detailed in FIGS. 14–16.

FIG. 18 shows an example of an embodiment similar to FIG. 17, but with only one level and no vias. Otherwise, all other processing and elements are the same as in FIG. 17.

Figure 19:
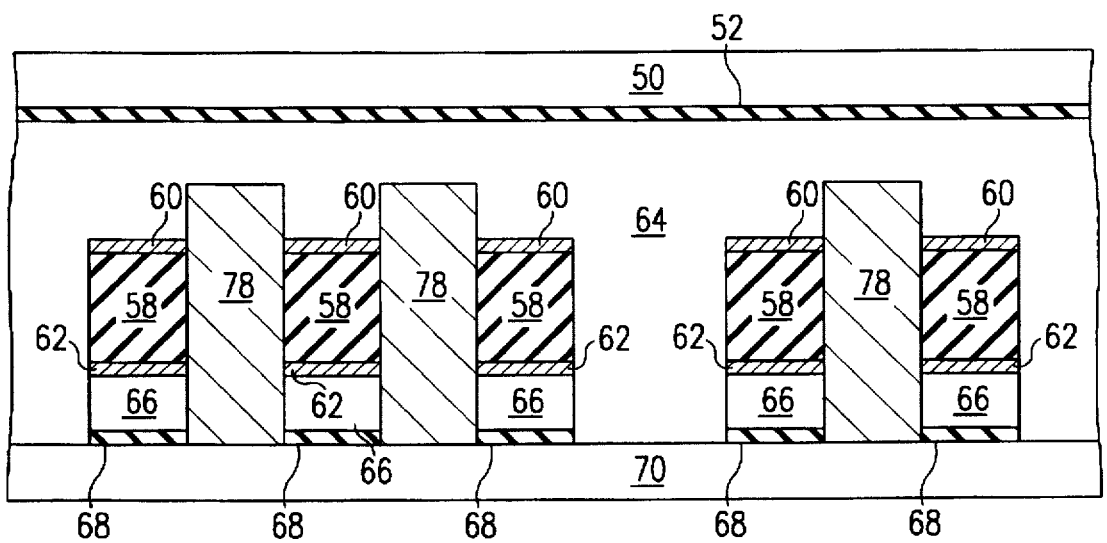

FIG. 19 shows an example embodiment similar to that of FIG. 18. However, during metal etch, the silicon dioxide layer 66 and the high-k layer 68 are also etched. Otherwise, all other processing and elements are the same as in FIG. 18.

Figure 20:
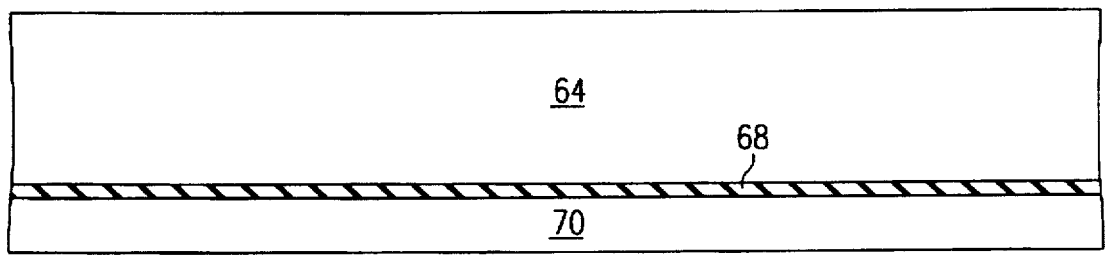
FIGS. 20–23 are cross-sectional views of a semiconductor device depicting an example of subsequent steps to produce yet another embodiment of the invention.

FIGS. 20-23 show a an example of a damascene metal deposition process which could be used in the invention. FIG. 20 shows a insulating layer 70 with a layer of high-k material 68 above it. A layer of silicon dioxide 64 is then deposited on top of the layer of high-k material 68.

Figure 21:
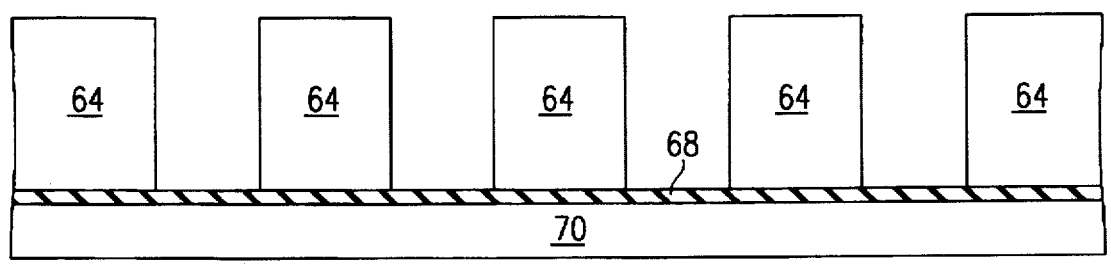

FIG. 21 shows the embodiment after trenches have been patterned and etched in the layer of silicon dioxide. The trenches stop at the beginning of the high-k material layer 68.

Figure 22:
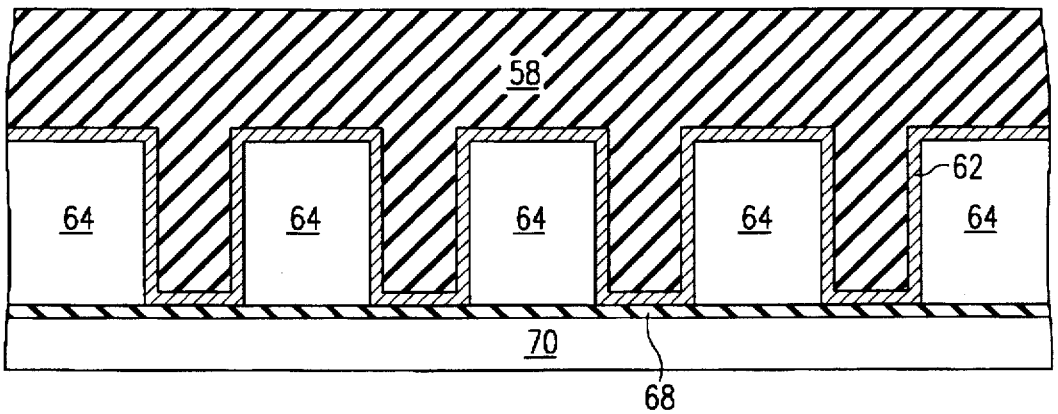

FIG. 22 shows the embodiment after a metal barrier layer 62 and a metal layer 58 have been deposited on top of the silicon dioxide and within the trenches.

Figure 23:
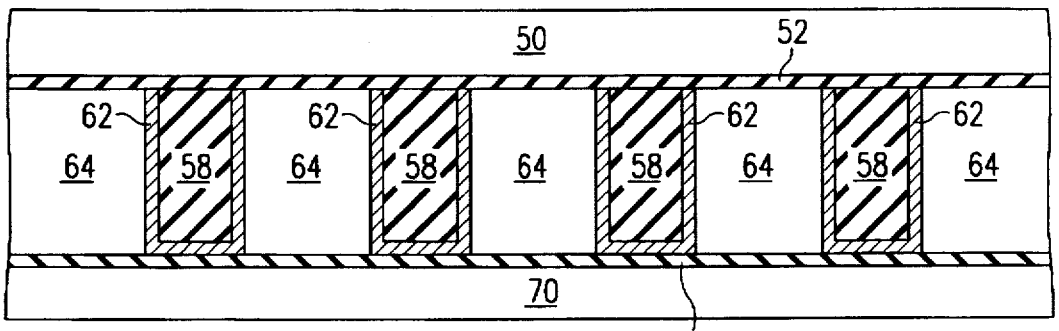

FIG. 23 shows the embodiment after the excess of the metal barrier layer 62 and the metal layer 58 has been polished off and another high-k layer 52 has been deposited on top of the metal leads 58 and the silicon dioxide 64. In addition, a final layer of silicon dioxide 50 is shown on top of the second high-k layer 52.

Furthermore, the embodiments represented in FIGS. 1-23 may be further modified. For example, the position and thickness of the high-k layers 52 and 68 can be adjusted based on performance and processing requirements. Additionally, the interlayer capacitance decreases with increasing the distance between the bottom of the metal barrier layer 62 and the high-k layer 68. Moreover, the second high-k layer does not have to be implemented. In addition, the insulating layers may also be implemented with various low-k materials. Various other modifications that are obvious to those skilled in the art could also be made and still remain in the spirit of the invention.

Figure 24:
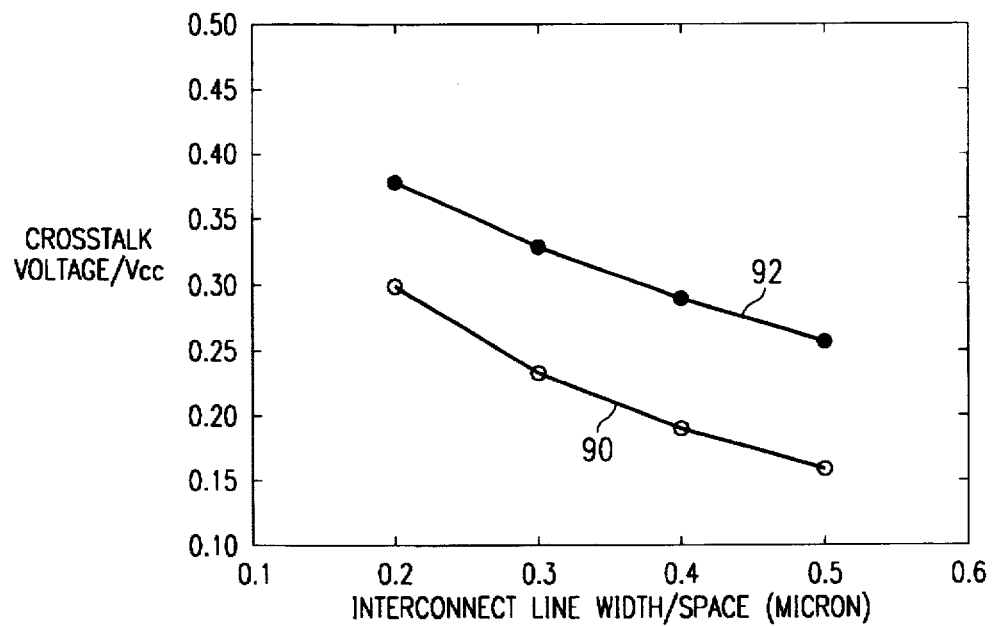
FIG. 24 is a graph comparing the ratio of crosstalk voltage to operating voltage (Vcc) for a pure silicon dioxide interlayer dielectric and the low-k, high-k embodiment shown in FIG. 12.

FIG. 24 shows the simulation result of the reduction in the ratio of crosstalk voltage to operating voltage (Vcc) for an example embodiment. The crosstalk voltage 90 for the example embodiment was compared the crosstalk voltage 92 of a pure silicon dioxide metal interconnect device. In the example embodiment represented in the graph, the high-k layer had a dielectric constant of 10, while the low-k layer had a dielectric constant of 1.5. In addition, the lead length was 4500 microns and the metal height was 0.7 microns. Similar results can be expected by the embodiments represented in FIGS. 10-13, 16, 18 and 19. However, the embodiment that produced the results shown in FIG. 24 did not include a second high-k layer. Hence, a greater reduction in crosstalk voltage can be expected when the second high-k layer is implemented.

The invention is not to be construed as limited to the particular examples described herein, as these are to be regarded as illustrative, rather than restrictive. The invention is intended to cover all processes for various material layers which do not depart from the spirit and scope of the invention. Other modifications and combinations will be apparent to those skilled in the art. It is therefore intended that the appended claims encompass any such modifications or embodiments.

I claim:

1. An interconnect structure in a semiconductor device comprising:

a semiconductor layer;

a first high-k layer above said semiconductor layer;

a plurality of interconnects above said first high-k layer, with a first low-k material between said plurality of interconnects that are at a relatively close proximity; and a second high-k layer above said plurality of interconnects.

2. The device of claim 1, wherein said plurality of interconnects are comprised of a metal barrier layer, a metal layer and a metal cap layer.

3. The device of claim 1, wherein said plurality of interconnects are comprised of aluminum.

4. The device of claim 1, wherein said device includes an insulating layer between said first high-k layer and said plurality of interconnects, wherein said insulating layer is comprised of a second low-k material.

5. The device of claim 1, wherein said device includes an insulating layer between said plurality of interconnects and said second high-k layer, wherein said insulating layer is comprised of a second low-k material.

6. The device of claim 1, wherein said plurality of interconnects are comprised of a damascene processed metal material.

7. The device of claim 4, wherein said insulating layer is comprised of silicon dioxide.

8. The device of claim 5, wherein said insulating layer is comprised of silicon dioxide.

9. An interconnect structure in a semiconductor device comprising:

a semiconductor layer;

a first high-k layer above said semiconductor layer;

a first insulating layer above said first high-k layer; and a plurality of interconnects above said first insulating layer with a first low-k material between said plurality of interconnects that are at a relatively close proximity.

10. The device of claim 9, wherein said device further includes a second insulating layer above said plurality of interconnects.

11. The device of claim 10, wherein said device further includes a second high-k layer above said second insulating layer.

12. The device of claim 9, wherein said plurality of interconnects are comprised of a metal barrier layer, a metal layer and a metal cap layer.

13. The device of claim 9, wherein said plurality of interconnects are comprised of aluminum.

14. The device of claim 9, wherein said first insulating layer is comprised of silicon dioxide.

15. The device of claim 10, wherein said second insulating layer is comprised of a second low-k material.

16. The device of claim 9, wherein said plurality of interconnects are comprised of a damascene, processed metal material.

17. An interconnect structure in a semiconductor device comprising:

a semiconductor layer;

a plurality of interconnects above said semiconductor layer, with a first low-k material between said plurality of interconnects that are at a relatively close proximity;

a first insulating layer around said plurality of interconnects; and a first high-k layer above said plurality of interconnects.

18. The device of claim 17, wherein said device further includes a second high-k layer above said semiconductor layer and below said plurality of interconnects.

19. The device of claim 18, wherein said device further includes a second insulating layer above said semiconductor layer and below said second high-k layer.

20. The device of claim 17, wherein said plurality of interconnects are comprised of a metal barrier layer, a metal layer and a metal cap layer.

21. The device of claim 17, wherein said plurality of interconnects are comprised of aluminum.

22. The device of claim 17, wherein said first insulating layer is comprised of silicon dioxide.

23. The device of claim 17, wherein said device includes a second insulating layer above said first high-k layer, wherein said second insulating layer is comprised of a second low-k material.

24. The device of claim 17, wherein said plurality of interconnects are comprised of a damascene processed metal material.

25. An interconnect structure in a semiconductor device comprising:

a semiconductor layer;

a first high-k layer above said semiconductor layer;

a plurality of interconnects above said first high-k layer, with a first low-k material between said plurality of interconnects that are at a relatively close proximity;

an insulating layer around said plurality of interconnects; and a second high-k layer above said insulating layer and said plurality of interconnects.

* * * * *